United States Patent
Selim et al.

(10) Patent No.: US 9,871,344 B2
(45) Date of Patent: Jan. 16, 2018

(54) TUNABLE LASER AND METHOD FOR TUNING A LASING MODE

(71) Applicant: Huawei Technologies Co., Ltd., Shenzhen (CN)

(72) Inventors: Ramsey Selim, Shenzhen (CN); Karl Boylan, Reading (GB); Richard Wyatt, Ipswich (GB); Ian Lealman, Ipswich (GB)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/448,125

(22) Filed: Mar. 2, 2017

(65) Prior Publication Data
US 2017/0310083 A1    Oct. 26, 2017

Related U.S. Application Data

(63) Continuation of application No. PCT/EP2015/070058, filed on Sep. 2, 2015.

(30) Foreign Application Priority Data

Sep. 2, 2014 (EP) .................................... 14183212

(51) Int. Cl.
*H01S 5/00* (2006.01)
*H01S 5/026* (2006.01)
(Continued)

(52) U.S. Cl.
CPC ............ *H01S 5/0268* (2013.01); *H01S 5/026* (2013.01); *H01S 5/028* (2013.01); *H01S 5/062* (2013.01);
(Continued)

(58) Field of Classification Search
CPC ...... H01S 5/0612; H01S 5/0268; H01S 5/028; H01S 5/1092; H01S 5/062; H01S 5/026;
(Continued)

(56) References Cited

U.S. PATENT DOCUMENTS 6,331,908 B1 * 12/2001 Adams ............... H04B 10/2537
                                                    372/50.11
6,931,036 B2    8/2005 Thourhout
(Continued)

FOREIGN PATENT DOCUMENTS

EP              1058358 A1    12/2000
WO      WO 2016045087 A1     3/2016

OTHER PUBLICATIONS

Doerr et al., "Multifrequency Laser Having Integrated Amplified Output Coupler for High-Extinction-Ratio Modulation with Single-Mode Behavior," IEEE Photonics Technology, vol. 10, No. 10, XP11431670 pp. 1374-1377, Institute of Electrical and Electronic Engineer, New York, New York (Oct. 1998).
(Continued)

*Primary Examiner* — Kinam Park
(74) *Attorney, Agent, or Firm* — Leydig, Voit & Mayer, Ltd.

(57) ABSTRACT

A tunable laser for tuning a lasing mode based on light beams travelling through at least one block of channel waveguides with at least two tunable combs, includes: a frequency selective optical multiplexer comprising a first terminal for receiving/transmitting light, at least one block of channel waveguides, each channel waveguide having a reflectively coated first tail and a second tail, and an optical coupling element optically coupling the first terminal with the second tails of the channel waveguides of the at least one block of channel waveguides, each of the channel waveguides having a different length; a gain element generating a broad spectrum of light, the gain element coupling the first (Continued)

terminal of the frequency selective optical multiplexer with a reflective element.

16 Claims, 12 Drawing Sheets

(51) Int. Cl.
- H01S 5/06 (2006.01)
- H01S 5/10 (2006.01)
- H01S 5/14 (2006.01)
- H01S 5/028 (2006.01)
- H01S 5/062 (2006.01)
- H01S 5/12 (2006.01)

(52) U.S. Cl.
CPC ............ *H01S 5/0612* (2013.01); *H01S 5/101* (2013.01); *H01S 5/1028* (2013.01); *H01S 5/1092* (2013.01); *H01S 5/1206* (2013.01); *H01S 5/142* (2013.01); *H01S 5/06246* (2013.01); *H01S 5/124* (2013.01); *H01S 5/1209* (2013.01); *H01S 5/1212* (2013.01); *H01S 5/1215* (2013.01)

(58) Field of Classification Search
CPC ...... H01S 5/101; H01S 5/1028; H01S 5/1206; H01S 5/1212; H01S 5/1209; H01S 5/1215; H01S 5/06246; H01S 5/124
See application file for complete search history.

(56) References Cited

U.S. PATENT DOCUMENTS

| | | | |
|---|---|---|---|
| 7,092,589 B2 | 8/2006 | Kish, Jr. et al. | |
| 7,110,627 B2 | 9/2006 | Rahman | |
| 7,136,553 B2 | 11/2006 | Kwon et al. | |
| 7,539,369 B2 * | 5/2009 | Yamazaki | G02B 6/12007 333/219 |
| 2004/0037342 A1 * | 2/2004 | Blauvelt | H01S 5/026 372/97 |
| 2004/0125833 A1 * | 7/2004 | Sarlet | H01S 5/06256 372/20 |
| 2008/0019638 A1 * | 1/2008 | Kwon | G02B 6/12007 385/29 |
| 2013/0235890 A1 | 9/2013 | Creazzo et al. | |
| 2014/0133511 A1 | 5/2014 | Tanaka | |

OTHER PUBLICATIONS

Bukkems et al., "A Tunable-MMI-Coupler-Based Wavelength Adjustable Laser," IEEE Journal of Quantum Electronics, vol. 43, No. 7, pp. 614-621, Institute of Electrical and Electronic Engineers, New York, New York (Jul. 2007).

Okamoto et al., "Fabrication of Silicon Reflection-Type AWGs with Distributed Bragg Reflectors," International Conference on Photonics in Switching, Institute of Electrical and Electronic Engineers, New York, New York (2013).

Babaud et al., "First Integrated Continuously Tunable AWG-Based Laser Using Electro-Optical Phase Shifters," (2005).

Heck et al., "Monolithic AWG-based Discretely Tunable Laser Diode with Nanosecond Switching Speed," IEEE Photonics Tech. Letters, vol. 22, No. 13, pp. 905-907, Institute of Electrical and Electronic Engineers,New York, New York (Jul. 1, 2009).

"New Approaches to Widely Tunable Semiconductor Lasers," Hendrikus Thesis, pp. 1-179 (2006).

Heaton et al., "Novel 1toN way integrated optical beam splitters using symmetric mode mixing in GaAs/AiGaAs multimode waveguides," Applied Physics Letter 61, American Institute of Physics (Oct. 12, 1992).

Docter et al., "Novel Integrated Tunable Laser using Filtered Feedback for simple and very fast tuning," ECOC, Vienna Austria (Sep. 20-24, 2009).

* cited by examiner

TUNABLE LASER AND METHOD FOR TUNING A LASING MODE

CROSS-REFERENCE TO RELATED APPLICATION

This application is a continuation of International Application No. PCT/EP2015/070058, filed on Sep. 2, 2015, which claims priority to European Patent Application No. EP14183212.1, filed on Sep. 2, 2014. The disclosures of the aforementioned applications are hereby incorporated by reference in their entireties.

TECHNICAL FIELD

The present disclosure relates to a tunable laser, in particular a widely tunable laser using half an Arrayed Waveguide Grating (AWG) and a method for tuning a lasing mode.

BACKGROUND

Wavelength-agile single-frequency laser diodes are being regarded as essential components for various telecommunication applications. Such laser diodes can be used as back-ups for fixed-wavelength transmitters. With wavelength division multiplexing (WDM) communication systems operating on a large number of optical wavelength channels, a large number of fixed-wavelength transmitters have to be kept as spares, which produces high additional costs. However, with a widely tunable laser that is able to operate on any of the available optical channels, costs can be significantly reduced. Tunable lasers are becoming enabling key components for optical networks. They can be used for functionalities like packet switching, wavelength conversion and light modulation, thereby making optical networks more flexible. Besides these applications, tunable lasers or laser diodes are also attractive light sources for sensing applications as well as for Fiber Bragg Grating (FBG) based sensor devices.

There is a need in telecommunication for tunable lasers, especially integrated widely tunable lasers. Currently industry companies use different methods to realize tunable lasers, for example such as advanced grating structures such as; DSDBR (Distributed Supermode Distributed Bragg Reflection) or SGDBR (Sample Grating Distributed Bragg Reflection) or usage of multiple DFBs (Distributed Feedback) with SOAs (Semiconductor Optical Amplifiers). Currently available tunable lasers have demanding processes or suffer from large footprint. Both lead to high cost due to waste of chip space or complexity of fabrication process and complexity of operation.

There is a need to provide a tunable laser that is easy to manufacture, in particular a tunable laser that requires small chip space and that may be easily produced in a chip fabrication process.

SUMMARY

It is the object of the invention to provide a widely tunable laser enabling a narrow line-width across a full optical wavelength spectrum that is easy to be manufactured.

This object is achieved by the features of the independent claims. Further implementation forms are apparent from the dependent claims, the description and the figures.

In order to describe the invention in detail, the following terms, abbreviations and notations will be used:

AWG: Arrayed Waveguide Grating,
FBG: Fiber Bragg Grating,
DSDBR: Distributed Supermode Distributed Bragg Reflection,
SOA: Semiconductor Optical Amplifier.

According to a first aspect, the invention relates to a tunable laser for tuning a lasing mode based on light beams travelling through at least one block of channel waveguides with at least two tunable combs, the tunable laser comprising: a frequency selective optical multiplexer comprising a first terminal for receiving/transmitting light, at least one block of channel waveguides, each channel waveguide having a reflectively coated first tail and a second tail, and an optical coupling element optically coupling the first terminal with the second tails of the channel waveguides of the at least one block of channel waveguides, each of the channel waveguides having a different length; a gain element generating a broad spectrum of light, the gain element coupling the first terminal of the frequency selective optical multiplexer with a reflective element; a phase element coupled to the gain element, wherein the phase element is configured to fine-tune the lasing mode and to offset a phase drift of the tunable laser; a plurality of optical tuners, each one coupled to a respective plurality of branches of the at least one block of channel waveguides, wherein the plurality of optical tuners are configured to tune a lasing mode based on light beams travelling through the at least one block of channel waveguides.

Such tunable laser provides a wide tuning as different lasing modes can be provided by the light beams traveling through the at least one block of channel waveguides. The optical multiplexer is frequency selective and the structure of the channel waveguide, each one having a different length allows producing a narrow line-width lasing mode across a full optical wavelength spectrum. As the block of channel waveguides is coated by a reflective coating at the first tail to reflect the light beams travelling through the channel waveguides and terminated by the second where the different wavelengths are superimposed to produce the lasing mode, the length of the channel waveguides can be reduced compared to conventional tunable lasers based on Arrayed Waveguide Grating.

In a first possible implementation form of the tunable laser according to the first aspect, the frequency selective optical multiplexer comprises a half section of an arrayed waveguide grating multiplexer.

By using a half section of an arrayed waveguide grating multiplexer, chip space can be reduced thereby the tunable laser can be easily and cost-efficiently manufactured. Further, energy losses due to the light beams traveling through half the distance can be reduced. Hence, optical amplifiers can be saved.

In a second possible implementation form of the tunable laser according to the first aspect as such or according to the first implementation form of the first aspect, the tunable laser comprises a first optical tuner coupled to a first plurality of branches of the at least one block of channel waveguides; and a second optical tuner coupled to a second plurality of branches of the at least one block of channel waveguides.

By using two optical tuners, production complexity can be reduced. Using only two optical tuners is sufficient to tune one or more supermodes in the optical medium. By applying the first tuner to a first plurality of branches and applying the second tuner to a second plurality of branches, different wavelengths can be tuned. This configuration is sufficient to allow discontinuous tuning (Vernier tuning) as well as continuous tuning between supermodes.

In a third possible implementation form of the tunable laser according to the second implementation form of the first aspect, the first plurality of branches of the at least one block of channel waveguides comprises a portion of the branches, in particular a half of the branches of the at least one block of channel waveguides.

By designing the tunable laser such that the first plurality of branches of the at least one block of channel waveguides includes a portion of all the branches, the design is very flexible. In particular the tuning of the lasing mode can apply a fine tuning to wavelengths of the first plurality of branches while a course tuning can be applied to wavelengths of the second plurality of branches. When the first plurality of branches of the at least one block of channel waveguides includes a half of all the branches, the tuning of the lasing mode can be of same precision over the full range of wavelength channels.

In a fourth possible implementation form of the tunable laser according to the first aspect as such or according to any of the preceding implementation forms of the first aspect, a first one of the plurality of optical tuners is configured to tune the lasing mode based on modifying a refractive index of channel waveguides of the respective plurality of branches coupled to the first one of the plurality of optical tuners; and a second one of the plurality of optical tuners is configured to tune the lasing mode based on modifying a refractive index of channel waveguides of the respective plurality of branches coupled to the second one of the plurality of optical tuners.

By modifying the refractive index of channel waveguides of the respective plurality of branches the lasing mode can be widely tuned over the full C-Band enabling a narrow line-width across the full optical wavelength spectrum.

In a fifth possible implementation form of the tunable laser according to the fourth implementation form of the first aspect, the plurality of optical tuners are configured to modify the refractive index based on at least one of the following: thermal tuning, current injection, voltage, stress.

The design of the tunable laser is very flexible. Depending on the requirements and the environment where the laser is applied different techniques for optical tuning can be applied such as denoted above.

In a sixth possible implementation form of the tunable laser according to the first aspect as such or according to any of the preceding implementation forms of the first aspect, the plurality of optical tuners are independently tunable.

When the plurality of optical tuners are independently tunable both techniques of discontinuous tuning using the Vernier effect as well as continuous tuning between supermodes to access all cavity modes can be applied, thereby providing a high degree of tuning flexibility.

In a seventh possible implementation form of the tunable laser according to the first aspect as such or according to any of the preceding implementation forms of the first aspect, the optical tuners are configured for discontinuous tuning by tuning one frequency comb generated by a first plurality of branches of the at least one block of channel waveguides while the other frequency comb generated by a second plurality of branches remains fixed.

Tuning one frequency comb while the other remains fixed allows the output frequency to hop between supermodes (e.g. 6 nm) using the Vernier effect. This allows fast tuning.

In an eighth possible implementation form of the tunable laser according to the seventh implementation form of the first aspect, the optical tuners are configured for continuous tuning by tuning both of the frequency combs together.

Tuning both frequency combs together allows continuous tuning of the mode between two supermodes. This allows very precise tuning.

In a ninth possible implementation form of the tunable laser according to the eighth implementation form of the first aspect, the optical tuners are configured to combine continuous tuning and discontinuous tuning.

A combination of discontinuous and continuous tuning allows access to all cavity modes over the C-Band. Hence, the tuning flexibility is improved.

In a tenth possible implementation form of the tunable laser according to the first aspect as such or according to any of the preceding implementation forms of the first aspect, the reflective element comprises a broadband partial reflector section.

Such a broadband partial reflector section allows reflection of wavelengths over a broad band of wavelengths, e.g. over the full C-Band, while only a part of the light is reflected back into the cavity to ensure lasing action occurs.

In an eleventh possible implementation form of the tunable laser according to the tenth implementation form of the first aspect, the broadband partial reflector section comprises a passive chirped grating section.

Such a passive chirped grating section provides a high spacing between the spectral lines of the wavelengths, thereby resulting in high selectivity and tunability over a large optical bandwidth.

In a twelfth possible implementation form of the tunable laser according to the first aspect as such or according to any of the preceding implementation forms of the first aspect, the optical coupling element comprises a star coupler.

Such a star coupler is able to optically combine the light beams travelling through the different branches of the block of channel waveguides in a power-efficient manner. By selecting a coupling ratio of the star coupler a maximum amount of output power at a minimum amount of input current can be provided by the laser.

In a thirteenth possible implementation form of the tunable laser according to the first aspect as such or according to any of the preceding implementation forms of the first aspect, the optical coupling element comprises a free propagation region coupling the first terminal with the at least one block of channel waveguides such that light beams travelling through the at least one block of channel waveguides are constructively and destructively interfering in the free propagation region.

Such a free propagation region makes light diffracting out of the first terminal propagating through the free propagation region and illuminating the channel waveguides, for example with a Gaussian distribution. Light diffracted from each waveguide can interfere constructively and destructively in the free propagation region.

In a fourteenth possible implementation form of the tunable laser according to the first aspect as such or according to any of the preceding implementation forms of the first aspect, the tunable laser is integrated together with a semiconductor optical amplifier on a chip.

By such integration on a chip highly efficient laser devices can be produced and integrated together with other electronic and optical circuitry.

According to a second aspect, the invention relates to a method for tuning a lasing mode, the method comprising: generating a broad spectrum of light; coupling the light between a first terminal of a frequency selective optical multiplexer and a reflective element; optically coupling the light between the first terminal of the frequency selective optical multiplexer and at least one block of channel waveguides of the frequency selective optical multiplexer, wherein each waveguide of the at least one block of channel waveguides has a reflectively coated first tail and a second tail coupled to the first terminal; tuning a lasing mode based on light beams travelling through a first plurality of branches of the at least one block of channel waveguides and based on light beams travelling through a second plurality of branches of the at least one block of channel waveguides.

Such a method provides a wide tuning as different lasing modes can be provided by the light beams traveling through the at least one block of channel waveguides. The optical multiplexer is frequency selective and the structure of the channel waveguide, each one having a different length allows producing a narrow line-width lasing mode across a full optical wavelength spectrum.

According to a third aspect, the invention relates to a tunable laser using half an arrayed waveguide grating (AWG) with high reflectivity coating and at least two tuning elements that thermally tune the half AWG branches so as to create at least two AWGs out of the half an AWG.

The tunable laser may use half an arrayed waveguide grating with a high reflectivity (HR) coating and two tuning elements that thermally tune the half AWG branches so as to create at least two AWGs out of the half AWG. These at least two AWGs may or may not share the same star coupler or other combining methods. The AWG acts as an external cavity for the laser, and the half AWG reduces the footprint of the chip, complexity of the fabrication process and thereby reduces the chip cost. The passive chirped grating acts as a broadband waveguide reflector for integration with other components. Other reflective means may serve the same purpose.

This new architecture halves the size with respect to other comparable existing solutions.

BRIEF DESCRIPTION OF THE DRAWINGS

Further embodiments of the invention will be described with respect to the following figures, in which.

DETAILED DESCRIPTION OF EMBODIMENTS

Figure 1:
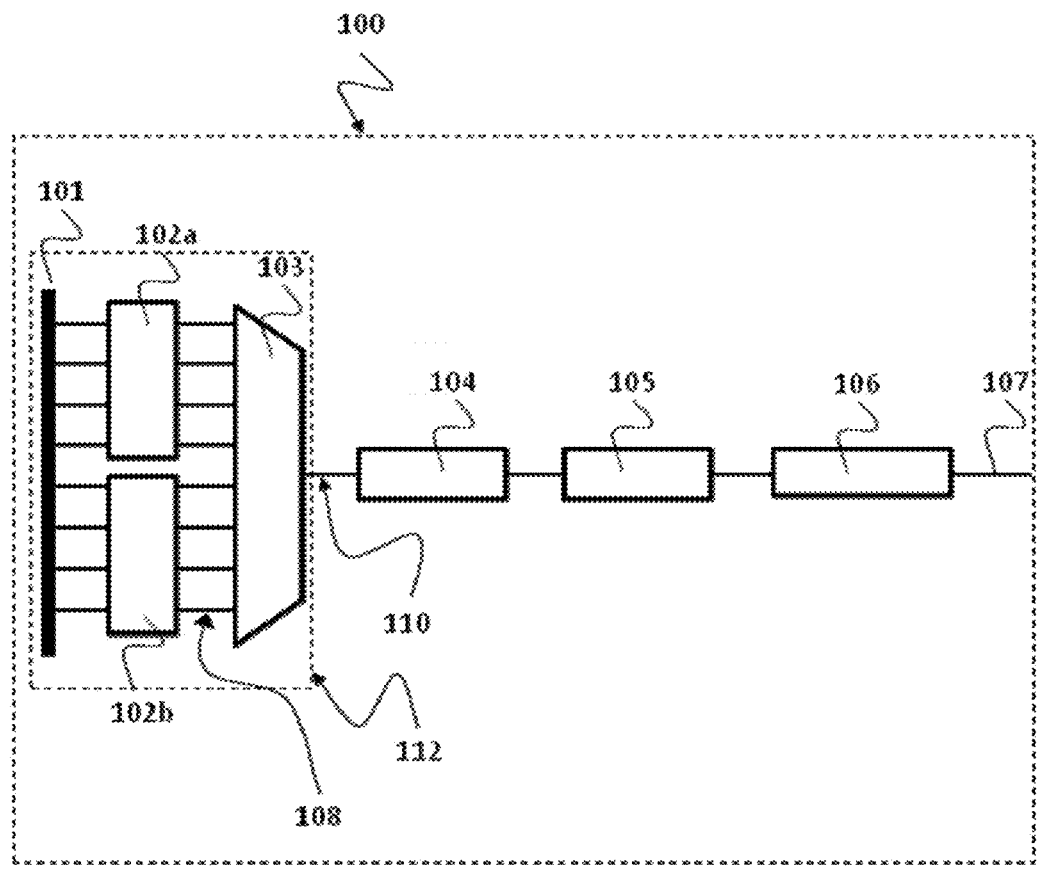
FIG. 1 shows a schematic diagram illustrating an architecture of a tunable laser according to an implementation form.

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that comments made in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

The devices and methods described herein may be based on tunable lasers and methods for tuning lasing modes. A tunable laser is a laser whose wavelength of operation can be altered in a controlled manner. While all laser gain media allow small shifts in output wavelength, only a few types of lasers allow continuous tuning over a significant wavelength range. A widely tunable laser allows continuous tuning over the full C-Band.

The methods and devices described herein may be implemented for producing integrated optical chips. The described devices and systems may include integrated circuits and/or passives and may be manufactured according to various technologies. For example, the circuits may include logic integrated circuits, analog integrated circuits, mixed signal integrated circuits, optical circuits, memory circuits and/or integrated passives.

In the following description methods and devices using (optical) waveguides are described. An optical waveguide is a physical structure that guides electromagnetic waves in the optical spectrum. Common types of optical waveguides include optical fiber and rectangular waveguides. Optical waveguides can be classified according to their geometry, e.g. as planar, strip, or fiber waveguides, mode structure, e.g. as single-mode or multi-mode, refractive index distribution, e.g. step or gradient index distribution and material, e.g. glass, polymer or semiconductor.

In the following description methods and devices using optical multiplexers and optical demultiplexers are described. An optical multiplexer multiplexes the wavelength channels onto a single output fiber, also denoted as terminal of the optical multiplexer. The optical demultiplexer separates wavelengths in an input fiber, e.g. a terminal, of the demultiplexer onto ports, e.g. channel waveguides. A frequency selective optical multiplexer as described in the following sections includes both, optical multiplexing as well as optical demultiplexing.

In the following detailed description methods and devices using laser structures are described. A laser structure comprises a two-sided active section/region, creating a light beam by spontaneous emission over a bandwidth around some center frequency and guiding said light beam, the active section performing optical amplification actions and two inactive or passive sections/regions, acting as reflectors. The active section is bounded by the two reflectors. Besides inactive or passive reflecting sections/regions, also sections with a transmission characteristic exist.

In the following detailed description methods and devices using reflective elements or reflectors and sections with transmission characteristics such as waveguides are described. The reflectors and sections with transmission characteristics are commonly denoted as resonators. Reflection and transmission sections are functionally characterized as having a reflection or transmission characteristic with a plurality of reflection or transmission peaks, commonly denoted as resonant peaks. The reflection or transmission characteristic has spaced reflection or transmission maxima points providing a maximum reflection or transmission of an associated wavelength. The resonator characteristic thus has a plurality of spectral response peaks. The resonator characteristic can be either regular, meaning that its resonant frequencies are all spaced apart by a same value, being the periodicity, or irregular, meaning that there is no fixed spacing between its resonant frequencies. Irregularity can be a random pattern of resonant frequencies or some structured pattern. Such a characteristic can be obtained via sampled gratings, which exhibit a comb-shaped reflections or transmission spectrum or via the so-called supergratings. The gratings or supergratings can also be characterized as distributed reflectors or transmission sections.

In the following detailed description methods and devices using gratings and sampled or structured gratings are described. Sampled or structured gratings can be described as structures in a waveguide system, having a periodically broken short-period structure including short period stripped regions alternating with non-stripped regions. The supergratings can be described as structures in a waveguide system having a diffractive grating having a plurality of repeating unit regions each having a constant length, thus forming a modulation period, and at least one parameter that determines the optical reflectivity or transmission of the diffractive grating varying depending on its position in each of the repeating unit regions along a direction of optical transmission in the laser, the diffractive grating extending by at least two modulation periods.

In the following detailed description methods and devices using gratings and chirped grating structures are described. A grating is any regularly spaced collection of essentially identical, parallel, elongated elements. Gratings usually consist of a single set of elongated elements, but can consist of two sets, in which case the second set is usually perpendicular to the first. A chirped grating is a structure with chirped spaces, i.e. spaces of varying depth designed to reflect varying wavelengths of lights. Chirped grating mirrors are used in lasers to reflect a wider range of light wavelengths than ordinary dielectric mirrors, or to compensate for the dispersion of wavelengths that can be created by some optical elements.

In the following description methods and devices using AWGs are described. Arrayed waveguide gratings are lightwave circuits that may be used as optical multiplexers or demultiplexers in optical systems such as wavelength division multiplexed (WDM) systems. AWGs are capable of multiplexing a large number of wavelengths into a single optical fiber, thereby increasing the transmission capacity of optical networks. AWGs may be planar lightwave circuits that may be fabricated by depositing doped and undoped layers of silica on a silicon substrate or monolithic layers or Silicon or polymer.

In the following description methods and devices using optical transmission within the C Band are described. Optical fiber communications typically operate in a wavelength region corresponding to different "telecom windows". The C Band describes one such window that is very widely used and utilizes wavelengths around 1.5 µm (1530-1565 nm). The losses of silica fibers are lowest in this region, and erbium-doped fiber amplifiers and laser diodes are available which offer very high performance.

FIG. 1 shows a schematic diagram illustrating an architecture of a tunable laser 100 according to an implementation form. The tunable laser 100 for tuning a lasing mode based on light beams travelling through at least one block of channel waveguides 108 with at least two tunable combs includes a frequency selective optical multiplexer 112, a gain element 105, a phase element 104 and a plurality of optical tuners 102a, 102b.

The frequency selective optical multiplexer 112 includes a first terminal 110 for receiving/transmitting light, at least one block of channel waveguides 108, each channel waveguide 108 having a reflectively coated first tail 101 and a second tail, and an optical coupling element 103 optically coupling the first terminal 110 with the second tails of the channel waveguides 108 of the at least one block of channel waveguides. Each of the channel waveguides 108 has a different length. The gain element 105 generates a broad spectrum of light. The gain element 105 couples the first terminal 110 of the frequency selective optical multiplexer 112 with the reflective element 106. The phase element 104 is coupled to the gain element 105. The phase element 104 is configured to fine-tune the lasing mode and to offset a phase drift of the tunable laser. Each one of the plurality of optical tuners 102a, 102b is coupled to a respective plurality of branches of the at least one block of channel waveguides 108. The plurality of optical tuners 102a, 102b is configured to tune a lasing mode based on light beams travelling through the at least one block of channel waveguides 108.

The frequency selective optical multiplexer 112 may include a half section of an arrayed waveguide grating multiplexer as described below with respect to FIGS. 2 to 4. The plurality of optical tuners may include two optical tuners, a first optical tuner 102a coupled to a first plurality of branches of the at least one block of channel waveguides 108; and a second optical tuner 102b coupled to a second plurality of branches of the at least one block of channel waveguides 108. The first plurality of branches of the at least one block of channel waveguides 108 may include a portion of the branches, in particular a half of the branches of the at least one block of channel waveguides 108 as described below with respect to FIGS. 2 to 4.

A first one of the plurality of optical tuners 102a may be configured to tune the lasing mode based on modifying a refractive index of channel waveguides 108 of the respective plurality of branches coupled to the first one 102a of the plurality of optical tuners. A second one of the plurality of optical tuners 102b may be configured to tune the lasing mode based on modifying a refractive index of channel waveguides 108 of the respective plurality of branches coupled to the second one 102b of the plurality of optical tuners as described below with respect to FIGS. 5, 6, 7 and 9. The optical tuners 102a, 102b may be configured to modify the refractive index based on thermal tuning, current injection, voltage or stress. The optical tuners 102a, 102b may be independently tunable.

The optical tuners 102a, 102b may be configured for discontinuous tuning by tuning one frequency comb generated by a first plurality of branches of the at least one block of channel waveguides 108 while the other frequency comb generated by a second plurality of branches remains fixed as described below with respect to FIG. 11. The optical tuners 102a, 102b may be configured for continuous tuning by tuning both of the frequency combs together as described below with respect to FIG. 12. The optical tuners 102a, 102b may be configured to combine continuous tuning and discontinuous tuning as described below with respect to FIG. 10.

The reflective element 106 may include a broadband partial reflector section. The broadband partial reflector section may include a passive chirped grating section as described below with respect to FIG. 8.

The optical coupling element 103 may include a star coupler. The optical coupling element 103 may include a free propagation region coupling the first terminal 110 with the at least one block of channel waveguides 108 such that light beams travelling through the at least one block of channel waveguides 108 are constructively and destructively interfering in the free propagation region.

The tunable laser 100 may be integrated together with a semiconductor optical amplifier on a chip.

The tunable laser 100 may also be denoted as AWG tunable laser as the frequency selective optical multiplexer may include half an AWG. The tunable laser 100 may include a high reflectivity reflection 101 to reflect the signal back into the AWG, doubling the effective AWG length. The frequency selective optical multiplexer 112 may include half an AWG to reduce the complexity, footprint and cost of the chip. The tunable laser 100 may include two tuning elements each covering a half of the AWG branches. The tuning elements 102a, 102b may be used for (thermal) wavelength tuning of the refractive index of the branches, thereby emulating two AWGs from one half of an AWG. The tunable laser 100 may include a phase section or phase element 104. The tunable laser 100 may include a gain element 105, e.g. gain chip or gain section. The tunable laser 100 may include a reflective element, e.g. a passive chirped grating section serving as a broadband waveguide reflector.

The high reflectivity coating 101 at the first tail may act as the cavity reflector for the lasing effect. This may be necessary for the lasing to occur. The optical tuners 102a, 102b may tune groups of AWG branches over a selected frequency range, using the Vernier effect. These tuners may be thermal tuners, for example. The half Arrayed waveguide grating (AWG) provides the frequency comb effect as shown in the FIG. 5. The gain chip 105 and the phase block 104 may be required for generating the lasing effect and for fine tuning. A passive chirped grating of the reflective element 106 may be necessary for the lasing to occur. The AWG branches may provide a wavelength equal to 2 times the branch length times the index. Laser light may be emitted at an output 107.

Figure 5:
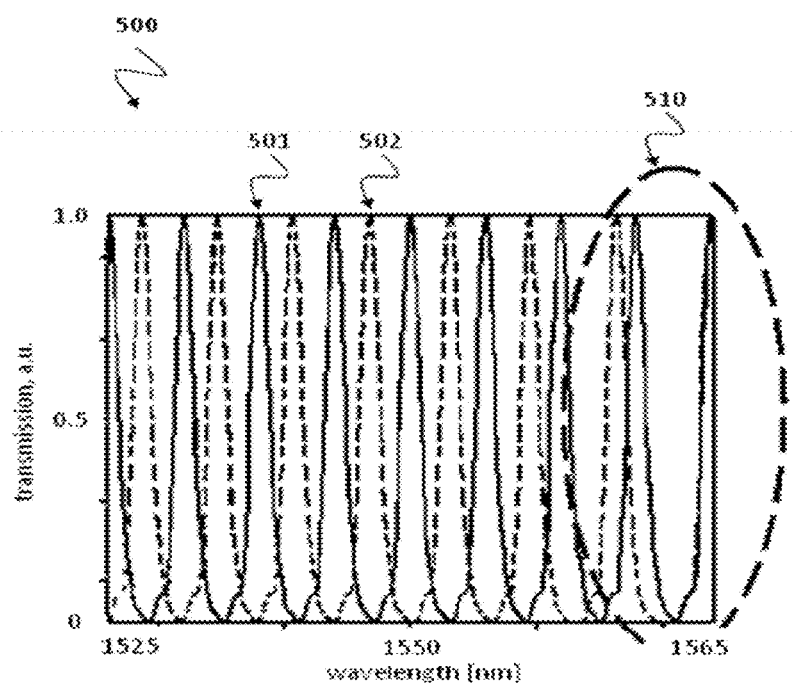
FIG. 5 shows a schematic diagram illustrating constructive and destructive interference in the two tunable combs of a frequency selective optical multiplexer according to an implementation form.

The gain chip 105 may generate a broad spectrum that travels between the high reflectivity coating 101 and the passive chirped grating. The passive chirped grating may act as a broadband mirror reflecting some of the light back into the cavity formed by the elements 101, 102 and 103 to ensure lasing action occurs. The AWG 103 may act as a frequency selective filter (demultiplexer). The selected frequencies may be determined by the length of the AWG branches 108. A comb of frequencies may be generated by a number of branches of different path lengths 108. The two sets of combs may have different path length difference, to generate two frequency combs with different spacings. In the absence of tuners, the light reflected back from the high reflectivity coating 101 (or other reflective means) may interfere in the AWG's FRP (Free Propagation Region) 103 and the single selected frequency to lase is the result of constructive and destructive interference between the two frequency combs 102, 103 and 108 as shown in FIG. 5. The tuners 102a, 102b may use thermal tuning to ensure narrow linewidth and low loss, however alternative tuning may be used too, such as current injection. In order to tune the device between two supermodes across the C-band, both tuners may be activated simultaneously.

The tunable laser 100 may be designed to use half an arrayed waveguide grating (AWG) with high reflectivity coating and tuning to reflect the signal back into the AWG and tune the AWG branches and thereby the half AWG acts as two full AWGs. The tuning elements 102a, 102b may tune the AWG branches, e.g. by applying thermal tuning, so as to create two AWGs out of the one while the high reflectivity coating 101 reduces the AWG to half the size. The AWG may act as an external cavity for the laser. All conventional tunable lasers that use AWGs use at least one full AWG. The passive chirped grating may act as a waveguide reflector for broadband and enables laser integration with an SOA (semiconductor optical amplifier) that can connect to other devices such as modulators.

The half AWG reduces the footprint of the chip (chip real estate), reduces the complexity of the fabrication process and thereby reduces the chip cost. The laser 100 may make use of passive chirped grating as the reflective element 106, thereby enabling the tunable laser 100 to be integrated to an SOA and then to other devices; e.g. Electro-Absorption Modulators (EAMs) and other modulators and devices.

Figure 2:
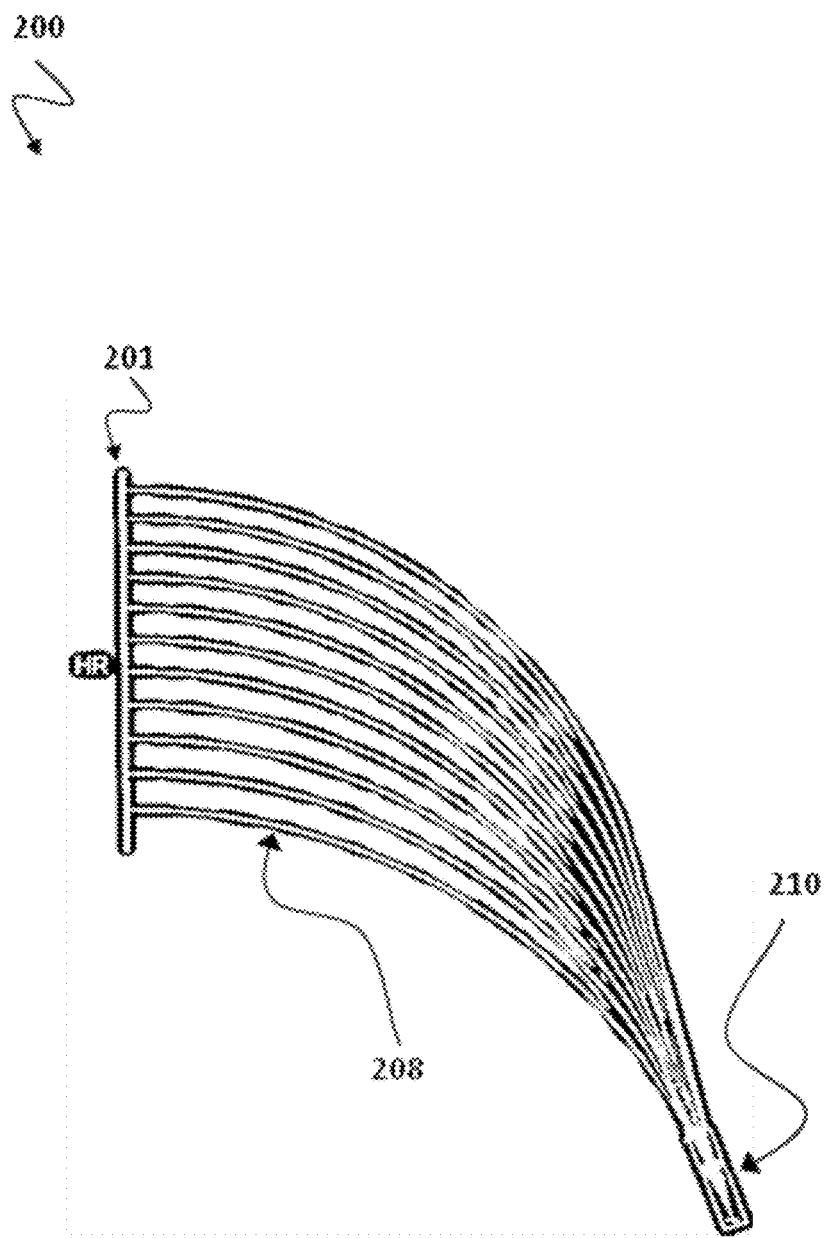
FIG. 2 shows a schematic diagram illustrating a frequency selective optical multiplexer formed as half an AWG according to a first implementation form.

FIG. 2 shows a schematic diagram illustrating a frequency selective optical multiplexer 200 formed as half an AWG according to a first implementation form.

The half AWG 200 includes a first terminal 210 for receiving/transmitting light and a block or bundle of channel waveguides 208 coupled to the first terminal by an optical coupler, e.g. a star coupler. Each of the channel waveguides 208 is reflectively coated at a first tail of the half AWG 200, e.g. by a high reflectivity coating 201. The half AWG 200 includes an optical coupling element where the first terminal is coupled to the block of channel waveguides at respective second tails of the channel waveguides 208. The reflective coating 201 at the first tails of the channel waveguides 208 may be a planar coating (as depicted in FIG. 2) or may be applied individually to each channel waveguide (not depicted in FIG. 2). Each of the channel waveguides 208 has a different length to facilitate propagation of different wavelengths in the channel waveguides 208. It is understood that any variations on the layout depicted in FIG. 2 are possible, for example multiple blocks of waveguides as shown below in FIGS. 3 and 4 and other designs not illustrated in the figures.

Figure 3:
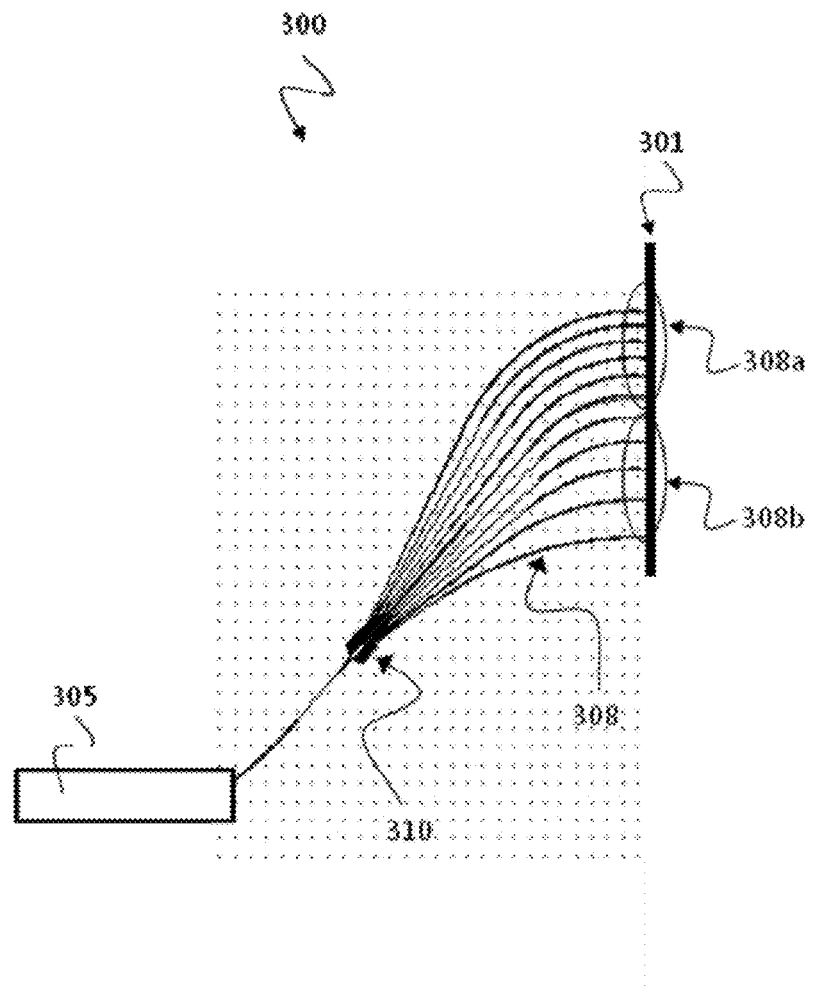
FIG. 3 shows a schematic diagram illustrating a frequency selective optical multiplexer formed as half an AWG according to a second implementation form.

FIG. 3 shows a schematic diagram illustrating a frequency selective optical multiplexer formed as half an AWG 300 according to a second implementation form.

The half AWG 300 includes a first terminal 310 for receiving/transmitting light and two blocks 308a, 308b or bundles of channel waveguides 308 coupled to the first terminal 310 by an optical coupler, e.g. a star coupler. Each of the channel waveguides 308 of the respective block 308a, 308b of channel waveguides is reflectively coated at a first tail of the half AWG 300, e.g. by a high reflectivity coating 301. The half AWG 300 includes an optical coupling element where the first terminal is coupled to the two blocks of channel waveguides at respective second tails of the channel waveguides 308. The high reflectivity coating 301 at the first tails of the channel waveguides 308 may be a planar coating (as depicted in FIG. 3) or may be applied individually to each channel waveguide (not depicted in FIG. 3) or may be applied individually for each block 308a, 308b of channel waveguides 308. Each of the channel waveguides 308 has a different length to facilitate propagation of different wavelengths in the channel waveguides 308.

The waveguide length difference of the first block 308a of channel waveguides may be ΔL1. The waveguide length difference of the second block 308b of channel waveguides may be ΔL2. The tuning elements (not depicted in FIG. 3) may be electrodes that may be covered separately on the two blocks 308a, 308b of channel waveguides. The wavelength may be tuned by the reflective index change of the half array waveguide caused by current or voltage implied on the two electrodes of the respective block of channel waveguides. Alternatively, thermal tuning elements may be implemented.

A gain element 305 may be used to generate the light coupled into the half AWG 300.

The half AWG 300 may be produced in a planar waveguide technology.

Figure 4:
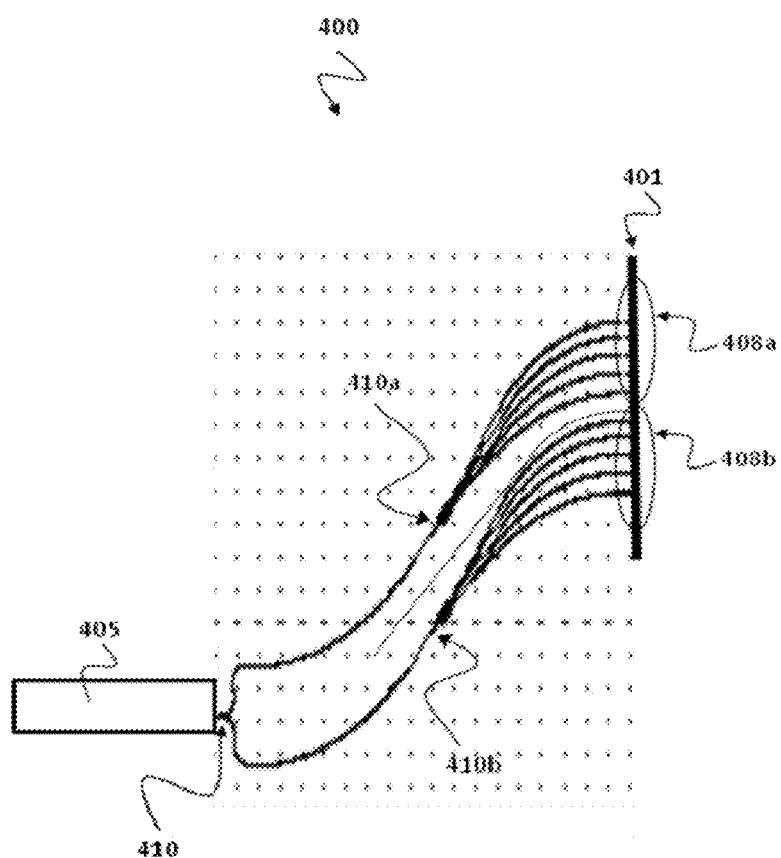
FIG. 4 shows a schematic diagram illustrating a frequency selective optical multiplexer formed as half an AWG according to a third implementation form.

FIG. 4 shows a schematic diagram illustrating a frequency selective optical multiplexer formed as half an AWG 400 according to a third implementation form.

The half AWG 400 includes two blocks 408a, 408b or bundles of channel waveguides 408 each one coupled to a respective first terminal 410a, 410b by a respective optical coupler, e.g. a star coupler. Each block 408a, 408b of channel waveguides has its own optical coupler. Each of the channel waveguides 408 of the respective block 408a, 408b of channel waveguides is reflectively coated at a first tail of the half AWG 400, e.g. by a high reflectivity coating 401. The half AWG 400 includes a first and a second optical coupling element. The first optical coupling element couples the first block 408a of channel waveguides 408 at their second tail to a first terminal 410a of the first block of channel waveguides. The second optical coupling element couples the second block 408b of channel waveguides 408 at their second tail to a first terminal 410b of the second block of channel waveguides. The first terminal 410a of the first block 408a of channel waveguides and the first terminal 410b of the second block 408b of channel waveguides are combined in a first terminal 410 of the frequency selective optical multiplexer 400 that is coupled to the gain element 405.

The high reflectivity coating 401 at the first tails of the two blocks 408a, 408b of channel waveguides 408 may be a planar coating (as depicted in FIG. 4) or may be applied individually to each channel waveguide (not depicted in FIG. 3) or may be applied individually for each block 408a, 408b of channel waveguides 408. Each of the channel waveguides 408 has a different length to facilitate propagation of different wavelengths in the channel waveguides 408.

The waveguide length difference of the first block 408a of channel waveguides may be ΔL1. The waveguide length difference of the second block 408b of channel waveguides may be ΔL2. The two blocks 408a, 408b of channel waveguides 408 may be spaced apart from each other. The tuning elements (not depicted in FIG. 4) may be electrodes that may be covered separately on the two blocks 408a, 408b of channel waveguides. The wavelength may be tuned by the reflective index change of the half array waveguide caused by current or voltage implied on the two electrodes of the respective block of channel waveguides. Alternatively, thermal tuning elements may be implemented.

The gain element 405 may be used to generate the light coupled into the half AWG 400.

The half AWG 400 may be produced in a planar waveguide technology.

FIG. 5 shows a schematic diagram illustrating constructive and destructive interference in the two tunable combs of a frequency selective optical multiplexer according to an implementation form.

The diagram illustrates constructive and destructive interference from a first tuning element and a second tuning element by using the Vernier effect. The peaks of the first tuning element are illustrated by first peaks 501 in the spectrum and the peaks of the second tuning element are illustrated by second peaks 502 in the spectrum. At a specific wavelength section 510 in the spectrum the peaks 501, 502 of both tuning elements superimpose generating a supermode. The result of the constructive and destructive interference is illustrated in FIG. 6.

Figure 6:
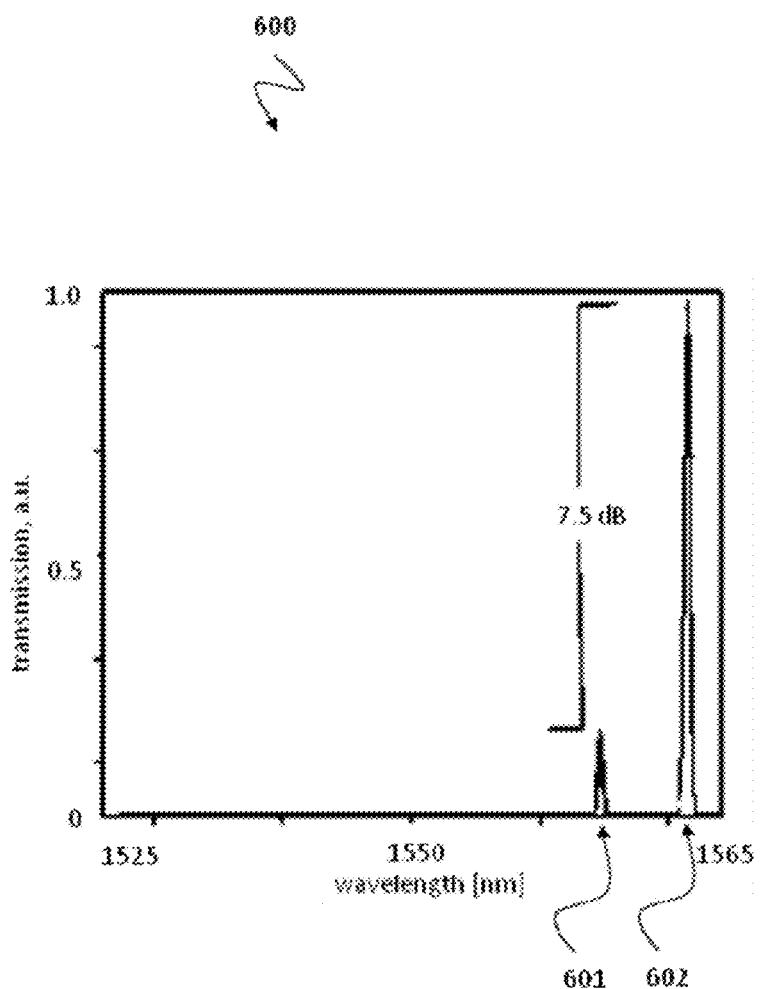
FIG. 6 shows a schematic diagram illustrating the result of constructive and destructive interference of the spectra depicted in FIG. 5.

FIG. 6 shows a schematic diagram illustrating the result of constructive and destructive interference of the spectra depicted in FIG. 5. The resulting spectra including the constructive and destructive interferences shows a high main peak 602 and a smaller side peak 601.

Figure 7:
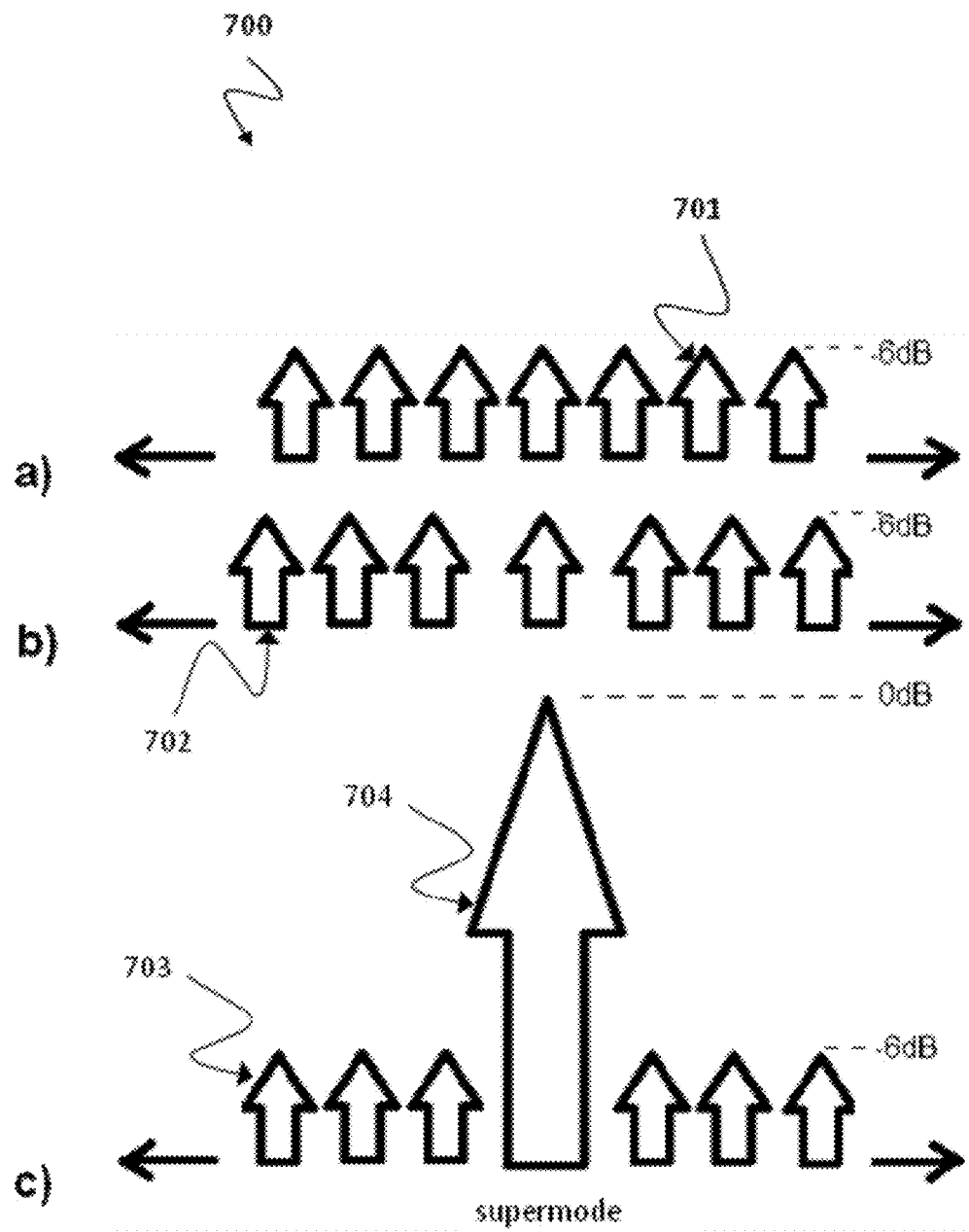
FIG. 7 shows a schematic diagram illustrating frequency selectivity of half an AWG with tuners creating a supermode out of the constructive interference between two aligned modes according to an implementation form.

FIG. 7 shows a schematic diagram 700 illustrating frequency selectivity of half an AWG with tuners creating a supermode out of the constructive interference between two aligned modes according to an implementation form. First peaks 701 (depicted in part a) tuned by the first tuning element have a different phase but a similar power than second peaks (depicted in part b) 702 tuned by the second tuning element. A superimposition of the first peaks 701 and the second peaks 702 in the optical combiner of the half AWG results in constructive and destructive interference resulting in generation of supermodes 704 and inferior cavity modes 703. These supermodes 704 occur with a larger period (i.e. smaller frequency) than a period with which the inferior cavity modes 703 occur.

Figure 8:
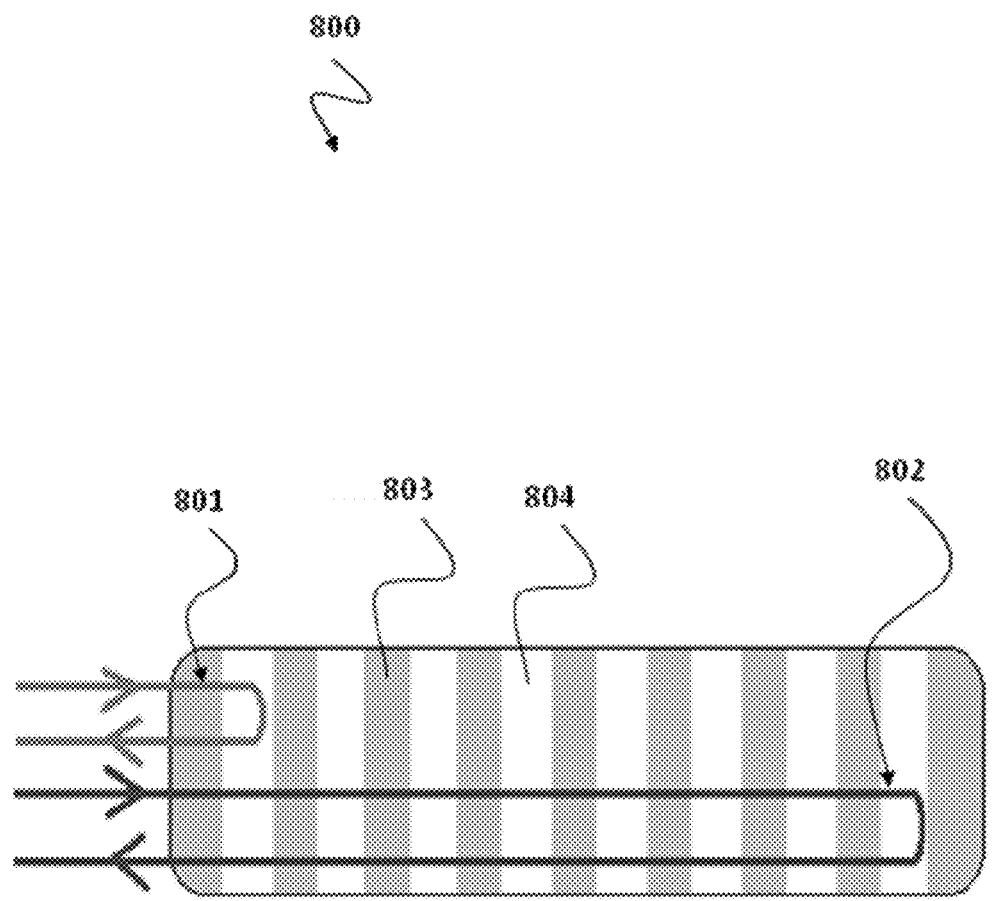
FIG. 8 shows a passive chirped grating used in reflective element of a tunable laser according to an implementation form.

FIG. 8 shows a passive chirped grating 800 used in reflective element of a tunable laser according to an implementation form. The grating 800 may be implemented as a structure of parallel stripes 803, 804 as depicted in FIG. 8. The passive chirped grating 800 makes that light of a shorter wavelength 801 intrudes less into the grating 800 than light of a longer wavelength 802 before it is reflected.

Alternatively, the passive chirped grating 800 may have a periodically broken short-period structure including short period stripped regions alternating with non-stripped regions. The passive chirped grating 800 may include supergratings that are structures having a diffractive grating with a plurality of repeating unit regions each of a constant length, thus forming a modulation period, and at least one parameter that determines the optical reflectivity or transmission of the diffractive grating. The at least one parameter may vary depending on its position in each of the repeating unit regions along a direction of optical transmission in the laser. The diffractive grating may extend by at least two modulation periods.

Figure 9:
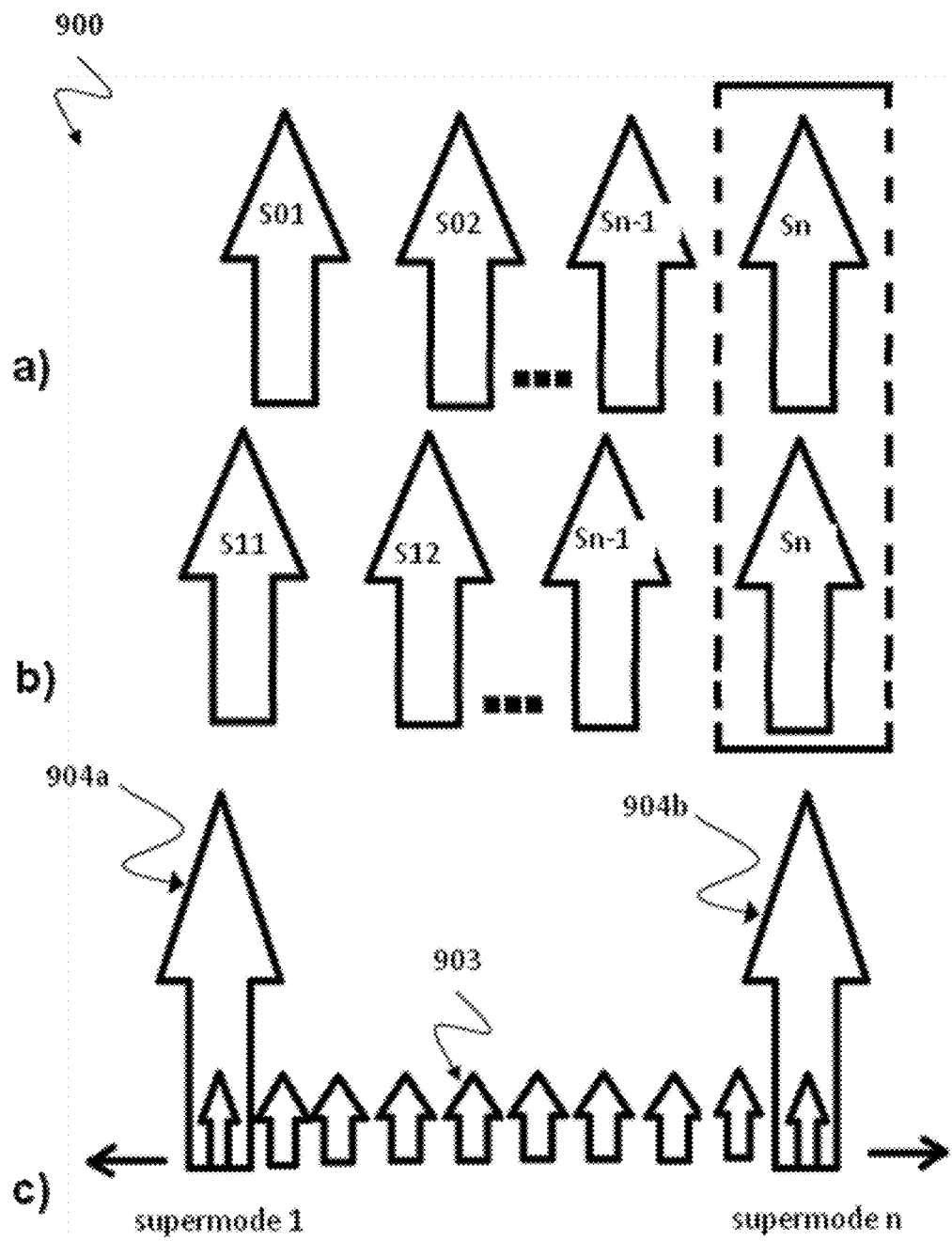
FIG. 9 shows a schematic diagram illustrating tuning of the supermodes by optical tuners of a tunable laser according to an implementation form.

FIG. 9 shows a schematic diagram illustrating tuning 900 of the supermodes by optical tuners of a tunable laser according to an implementation form.

The resulting spectrum depicted in part c including the constructive and destructive interferences shows high main peaks corresponding to supermodes 904a, 904b and smaller side peaks corresponding to inferior cavity modes 903.

To tune the laser over the C band the devices may use two modes of tuning which are discontinuous tuning using the Vernier effect and continuous tuning between supermodes to access all cavity modes.

First peaks S01, S02, Sn−1, Sn (depicted in part a) tuned by the first tuning element have a different phase but a similar power than second peaks S11, S12, Sn−1, Sn (depicted in part b) tuned by the second tuning element. A superimposition of the first peaks and the second peaks in the optical combiner of the half AWG results in constructive and destructive interference resulting in generation of supermodes 904a, 904b and inferior cavity modes 903 as depicted in part c. These supermodes 904a, 904b occur with a larger period (i.e. smaller frequency) than a period with which the inferior cavity modes 903 occur.

Figure 10:
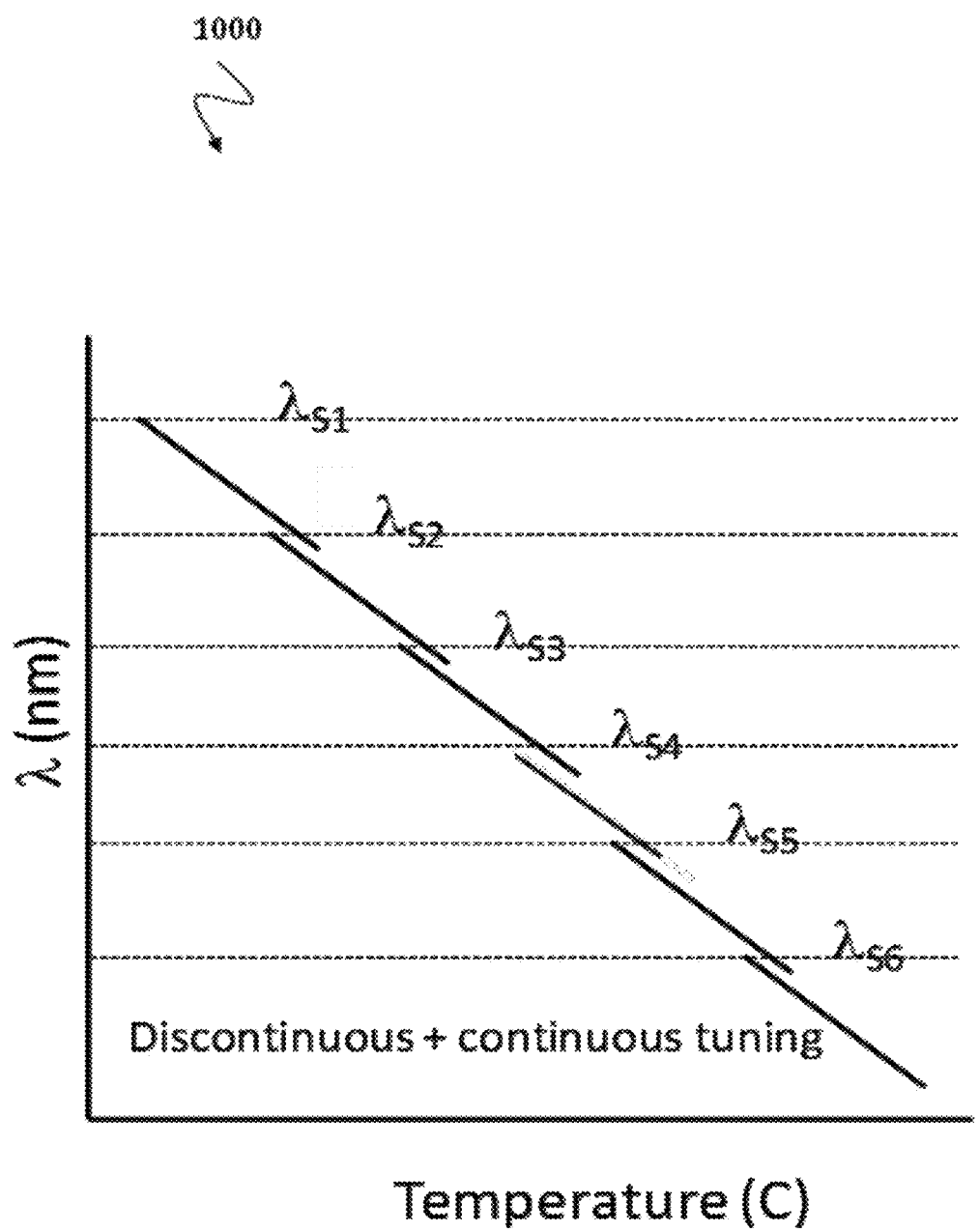
FIG. 10 shows a schematic diagram illustrating quasi-continuous tuning by optical tuners of a tunable laser according to an implementation form.
Figure 11:
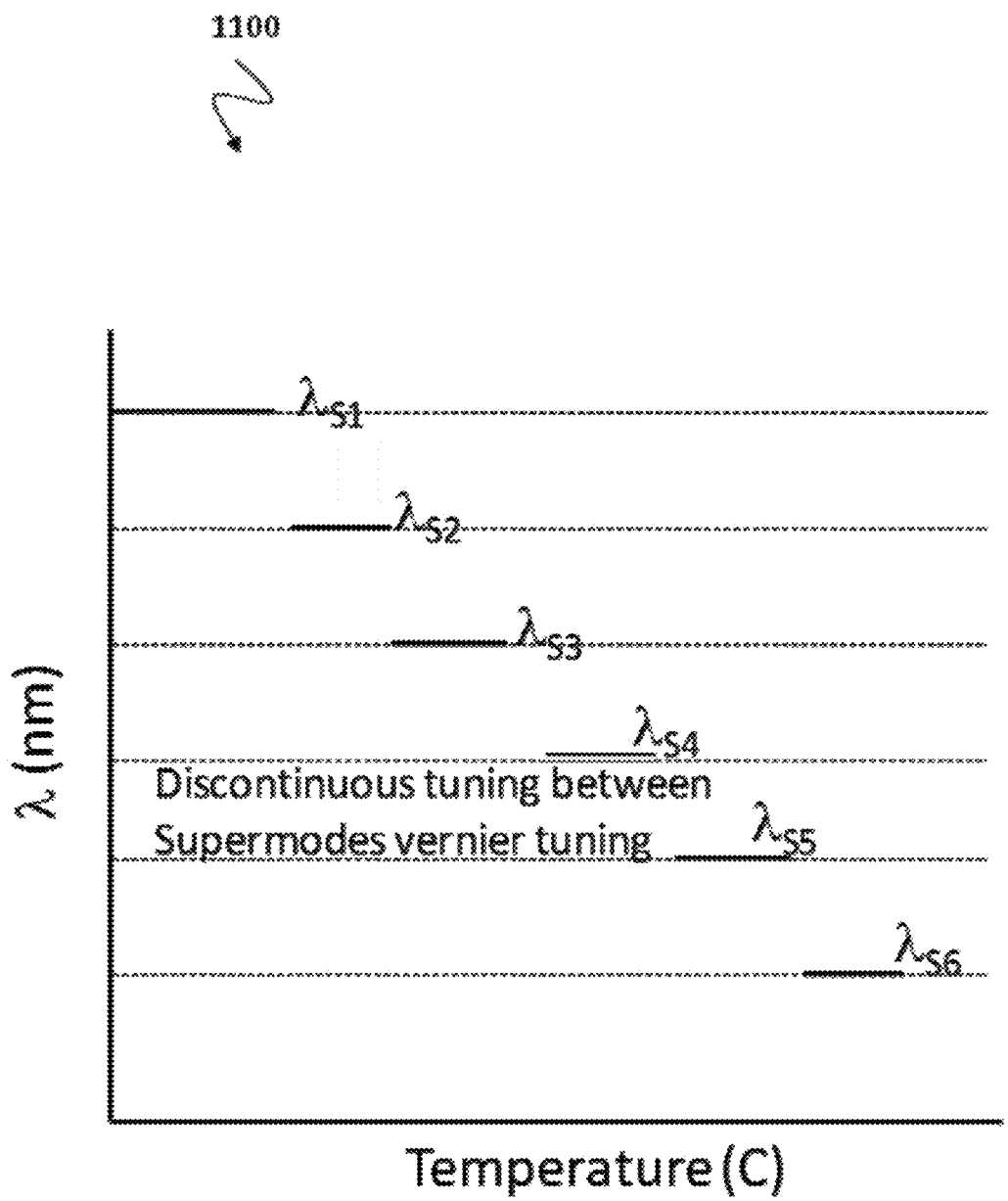
FIG. 11 shows a schematic diagram illustrating discontinuous tuning by optical tuners of a tunable laser according to an implementation form.

FIGS. 10, 11 show the two tuning mechanisms and how the combination of these two tuning mechanisms results in quasi-continuous tuning across the C band. Tuning one frequency comb while the other remains fixed allows the output frequency to "hop" between supermodes (6 nm) using the Vernier effect. Tuning both frequency combs together allows continuous tuning of the mode between to two supermodes. A combination of discontinuous and continuous tuning allows access to all cavity modes over the C band. The phase section allows for fine tuning of the selected mode and to be able to offset any drift over the life of the device.

FIG. 10 shows a schematic diagram illustrating quasi-continuous tuning 1000 by optical tuners of a tunable laser according to an implementation form. The diagram depicts wavelength λ in nanometer (nm) over temperature in Celsius applied to the thermal tuning elements. Depending on the applied temperature different lasing supermodes $\lambda_{S1}$, $\lambda_{S2}$, $\lambda_{S3}$, $\lambda_{S4}$, $\lambda_{S5}$, $\lambda_{S6}$ occur continuously with the applied temperature.

FIG. 11 shows a schematic diagram illustrating discontinuous tuning 1100 by optical tuners of a tunable laser according to an implementation form. The diagram depicts wavelength λ in nanometer (nm) over temperature in Celsius applied to the thermal tuning elements. Depending on the applied temperature different lasing supermodes $\lambda_{S1}$, $\lambda_{S2}$, $\lambda_{S3}$, $\lambda_{S4}$, $\lambda_{S5}$, $\lambda_{S6}$ occur discontinuously, i.e. in steps, with the applied temperature.

Figure 12:
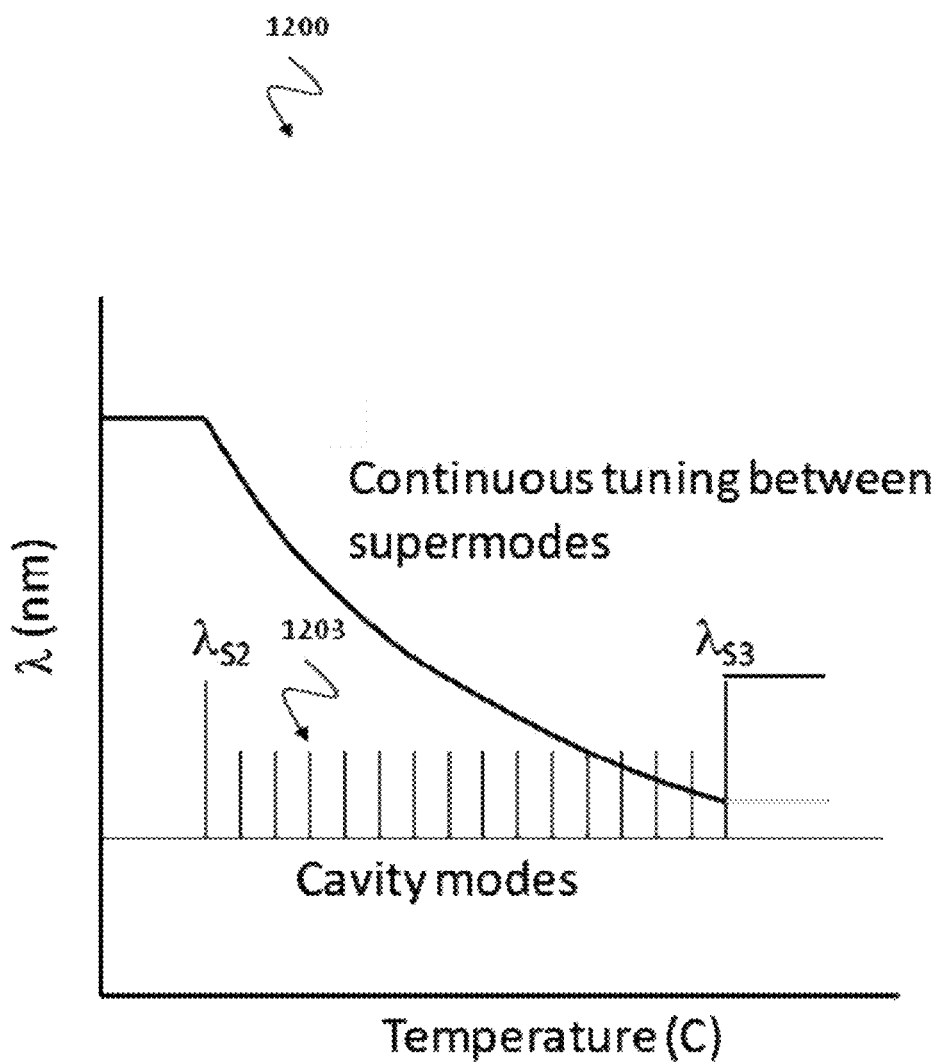
FIG. 12 shows a schematic diagram illustrating continuous tuning between supermodes by optical tuners of a tunable laser according to an implementation form.

FIG. 12 shows a schematic diagram illustrating continuous tuning 1200 between supermodes by optical tuners of a tunable laser according to an implementation form.

The diagram depicts wavelength λ in nanometer (nm) over temperature in Celsius applied to the thermal tuning elements. Depending on the applied temperature different lasing supermodes $\lambda_{S2}$, $\lambda_{S3}$ and different inferior cavity modes 1203 occur allowing continuous tuning between the supermodes.

Figure 13:
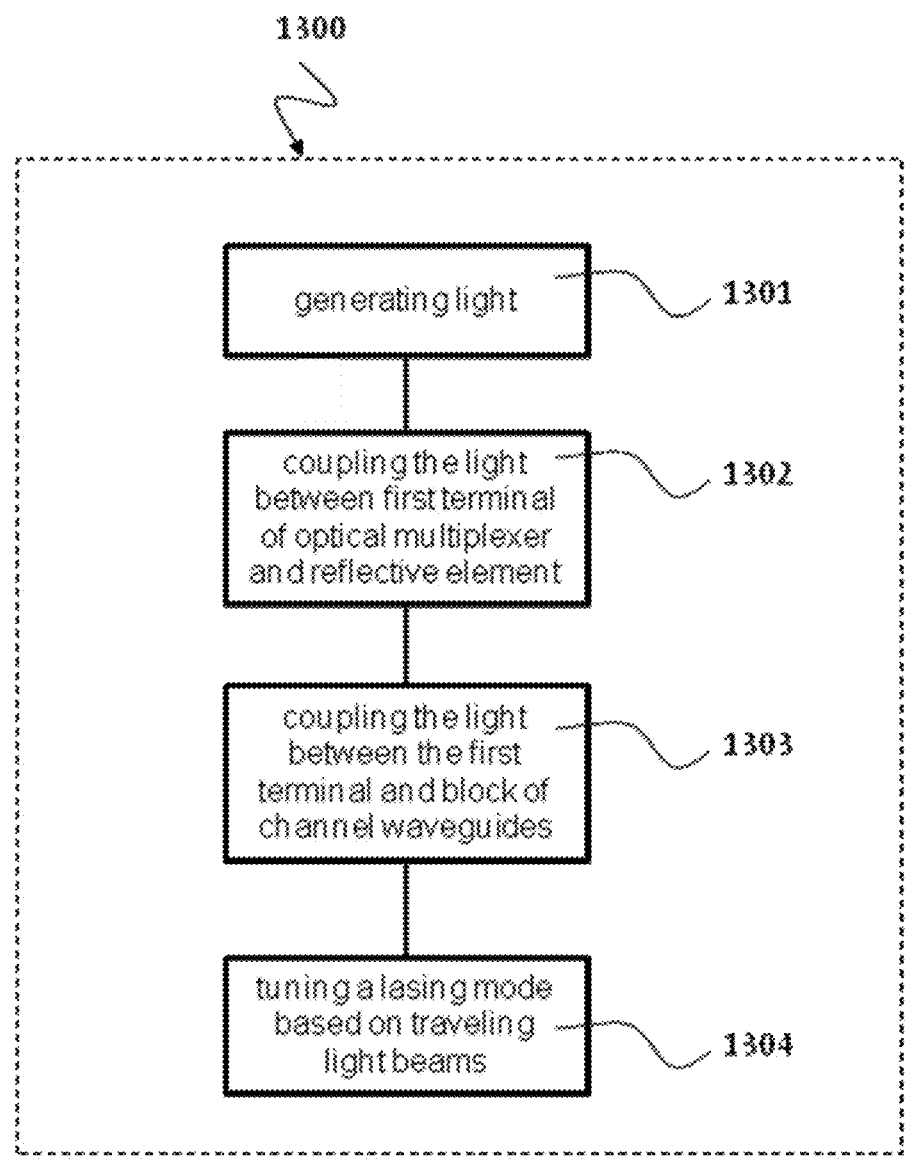
FIG. 13 shows a schematic diagram illustrating a method for tuning a lasing mode according to an implementation form.

FIG. 13 shows a schematic diagram illustrating a method for tuning a lasing mode according to an implementation form.

The method includes generating 1301 a broad spectrum of light; coupling 1302 the light between a first terminal of a frequency selective optical multiplexer and a reflective element; optically coupling 1303 the light between the first terminal of the frequency selective optical multiplexer and at least one block of channel waveguides of the frequency selective optical multiplexer, wherein each waveguide of the at least one block of channel waveguides has a reflectively coated first tail and a second tail coupled to the first terminal; and tuning 1304 a lasing mode based on light beams travelling through a first plurality of branches of the at least one block of channel waveguides and based on light beams travelling through a second plurality of branches of the at least one block of channel waveguides.

The frequency selective optical multiplexer may correspond to a frequency selective optical multiplexer as described above with respect to FIGS. 1 to 12. The reflective element may correspond to the reflective element as describe above with respect to FIGS. 1 to 12. The method may be implemented by using a tunable laser as described above with respect to FIGS. 1 to 12.

The methods, systems and devices described herein may be implemented as optical circuit within a chip or an integrated circuit or an application specific integrated circuit (ASIC). The invention can be implemented in digital and/or analogue electronic and optical circuitry.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein. Additionally, statements made herein characterizing the invention refer to an embodiment of the invention and not necessarily all embodiments.

What is claimed is:

1. A tunable laser for tuning a lasing mode based on light beams travelling through at least one block of channel waveguides with at least two tunable combs, the tunable laser comprising:
- a frequency selective optical multiplexer comprising a first terminal for receiving and/or transmitting light, at least one block of channel waveguides, each channel waveguide having a reflectively coated first tail and a second tail, and an optical coupling element optically coupling the first terminal with the second tails of the channel waveguides of the at least one block of channel waveguides, each of the channel waveguides having a different length;
- a gain element, configured to generate a broad spectrum of light, the gain element coupling the first terminal of the frequency selective optical multiplexer with a reflective element;
- a phase element coupled to the gain element, wherein the phase element is configured to fine-tune the lasing mode and to offset a phase drift of the tunable laser; and
- a plurality of optical tuners, each optical tuner coupled to a respective plurality of branches of the at least one block of channel waveguides, wherein the plurality of optical tuners are configured to tune a lasing mode based on light beams travelling through the at least one block of channel waveguides.

2. The tunable laser of claim 1, wherein the frequency selective optical multiplexer comprises a half section of an arrayed waveguide grating multiplexer.

3. The tunable laser of claim 1, wherein the plurality of optical tuners comprise:
- a first optical tuner coupled to a first plurality of branches of the at least one block of channel waveguides; and
- a second optical tuner coupled to a second plurality of branches of the at least one block of channel waveguides.

4. The tunable laser of claim 3, wherein the first plurality of branches of the at least one block of channel waveguides comprises half of the branches of the at least one block of channel waveguides.

5. The tunable laser of claim 1, wherein a first optical tuner of the plurality of optical tuners is configured to tune the lasing mode based on modifying a refractive index of channel waveguides of the respective plurality of branches coupled to the first optical tuner; and
- wherein a second optical tuner of the plurality of optical tuners is configured to tune the lasing mode based on modifying a refractive index of channel waveguides of the respective plurality of branches coupled to the second optical tuner.

6. The tunable laser of claim 5, wherein the plurality of optical tuners are configured to modify the refractive index based on thermal tuning, current injection, voltage, and/or stress.

7. The tunable laser of claim 1, wherein the plurality of optical tuners are independently tunable.

8. The tunable laser of claim 1, wherein the optical tuners are configured for discontinuous tuning by tuning a first frequency comb generated by a first plurality of branches of the at least one block of channel waveguides while a second frequency comb generated by a second plurality of branches remains fixed.

9. The tunable laser of claim 8, wherein the optical tuners are configured for continuous tuning by tuning both the first frequency comb and the second frequency comb together.

10. The tunable laser of claim 9, wherein the optical tuners are configured to combine continuous tuning and discontinuous tuning.

11. The tunable laser of claim 1, wherein the reflective element comprises a broadband partial reflector section.

12. The tunable laser of claim 11, wherein the broadband partial reflector section comprises a passive chirped grating section.

13. The tunable laser of claim 1, wherein the optical coupling element comprises a star coupler.

14. The tunable laser of claim 1, wherein the optical coupling element comprises a free propagation region coupling the first terminal with the at least one block of channel waveguides such that light beams travelling through the at least one block of channel waveguides are constructively and destructively interfering in the free propagation region.

15. The tunable laser of claim 1. wherein the tunable laser is integrated together with a semiconductor optical amplifier on a chip.

16. A method for tuning a lasing mode, the method comprising:
- generating, by a tunable laser, a broad spectrum of light;
- coupling, by the tunable laser, light between a first terminal of a frequency selective optical multiplexer and a reflective element;
- optically coupling, by the tunable laser, light between the first terminal of the frequency selective optical multiplexer and at least one block of channel waveguides of the frequency selective optical multiplexer, wherein each waveguide of the at least one block of channel waveguides has a reflectively coated first tail and a second tail coupled to the first terminal; and
- tuning, by the tunable laser, a lasing mode based on light beams travelling through a first plurality of branches of the at least one block of channel waveguides and based on light beams travelling through a second plurality of branches of the at least one block of channel waveguides.

* * * * *